(12) United States Patent
Teboulle et al.

(10) Patent No.: US 12,153,074 B2
(45) Date of Patent: Nov. 26, 2024

(54) DETECTION OF THE OPENING OF AN EXTERNAL TRANSFORMER

(71) Applicant: SAGEMCOM ENERGY & TELECOM SAS, Rueil Malmaison (FR)

(72) Inventors: Henri Teboulle, Rueil Malmaison (FR); Marc Jeanrot, Rueil Malmaison (FR); Julien Sotiere, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 56 days.

(21) Appl. No.: 17/840,350

(22) Filed: Jun. 14, 2022

(65) Prior Publication Data
US 2022/0404403 A1 Dec. 22, 2022

(30) Foreign Application Priority Data
Jun. 16, 2021 (FR) ...................... 2106371

(51) Int. Cl.
*G01R 22/06* (2006.01)
*G01R 19/165* (2006.01)

(52) U.S. Cl.
CPC ....... *G01R 22/06* (2013.01); *G01R 19/16571* (2013.01); *G01R 19/16576* (2013.01)

(58) Field of Classification Search
CPC .............. G01R 22/06; G01R 19/16571; G01R 19/16576; G01R 31/62; G01R 31/72; G01R 31/50

USPC ........................................ 324/74, 76.11, 110
See application file for complete search history.

(56) References Cited

U.S. PATENT DOCUMENTS

| | | | |
|---|---|---|---|
| 9,726,706 B1* | 8/2017 | Zhang ..................... | G01R 31/72 |
| 10,955,490 B2* | 3/2021 | Kaufmann ............. | G01R 31/72 |
| 11,585,865 B2* | 2/2023 | Mauney ................. | G01R 31/62 |
| 2013/0057307 A1 | 3/2013 | Fischer | |
| 2018/0149682 A1* | 5/2018 | Klapper ................. | H02H 3/044 |
| 2018/0261999 A1* | 9/2018 | Shi .......................... | G01R 31/62 |
| 2021/0215772 A1* | 7/2021 | Mauney ........... | G01R 19/16566 |

FOREIGN PATENT DOCUMENTS

EP   3561523 A1   10/2019

* cited by examiner

*Primary Examiner* — Giovanni Astacio-Oquendo
(74) *Attorney, Agent, or Firm* — MUNCY, GEISSLER, OLDS & LOWE, P.C.

(57) ABSTRACT

An electricity meter includes a front circuit connected to an external transformer and a conductor connected to the external transformer via the front circuit; a test circuit including a test generation chain and a test measuring chain connected to the conductor and a processing component; the test generation chain being arranged to apply a test voltage on the conductor, which produces a test current circulating in the test measuring chain, the test voltage having a level which depends on the impedance of the external transformer, the processing component being arranged to detect a cutoff of the external transformer when the level of the test voltage is greater than a predefined detection threshold.

12 Claims, 3 Drawing Sheets

DETECTION OF THE OPENING OF AN EXTERNAL TRANSFORMER

The invention relates to the field of electricity meters, and in particular to meters intended for industrial applications.

BACKGROUND OF THE INVENTION

Electricity meters intended for an industrial use can measure very high intensity currents, up to 2000A typically.

Such a meter, for example, a three-phase meter, is conventionally connected to the phases of the distribution network via external transformers mounted on the phases. These external transformers have a transformation ratio equal to 2000 typically.

It seems very interesting to be able to detect the opening of an external transformer circuit, without intervention of an operator, in order to quickly and at a low cost, prevent the occurrence of a fault for the client and/or the energy distributor.

OBJECT OF THE INVENTION

The invention aims to detect the opening of an external transformer connected to a meter, simply, inexpensively, reliably and without intervention of an operator.

SUMMARY OF THE INVENTION

In view of achieving this aim, an electricity meter is proposed, comprising:
- a front circuit arranged to be connected to an external current transformer located outside of the meter and mounted on a phase of a distribution network;
- a conductor arranged to be connected to the external current transformer via the front circuit;
- a test circuit comprising a test generation chain having an output connected to the conductor, a test measuring chain having an input connected to the conductor, and a processing component;
- the test generation chain comprising a voltage generator and being arranged to apply a test voltage on the conductor, the test voltage producing a test current circulating in the test measuring chain and said test voltage having a level which depends on an equivalent impedance of the front circuit and of the external current transformer, the test measuring chain being arranged to measure the level of the test voltage, the processing component being arranged to acquire the level of the test voltage and to detect a cutoff of the external current transformer when the level of the test voltage is greater than a predefined detection threshold.

Thus, by applying the test voltage on the conductor which is connected to the external current transformer via the front circuit, a test current is produced which circulates in the test measuring chain. The level of said test voltage depends on the impedance of the external current transformer. The comparison of the level of said test voltage with the predefined detection threshold therefore makes it possible to detect if the external current transformer is open or not.

The invention thus provides a very reliable and very robust detection criterion, which makes it possible to detect a cutoff of the external transformer without intervention of an operator. The invention is not very complex to implement and inexpensive, since it only requires integrating in the meter, a relatively simple test circuit.

In addition, an electricity meter such as described above is proposed, wherein the front circuit comprises an internal transformer arranged to be connected to the external current transformer.

In addition, an electricity meter such as described above is proposed, further comprising a main measuring chain having an input connected to the conductor, the main measuring chain being arranged such that a main measuring current, image of a phase current circulating over the phase, circulates in the main measuring chain, the processing component being arranged to acquire a level of the main measuring current, to compare it with a predefined test threshold, and to control the test generation chain, such that this applies the test voltage on the conductor when the level of the main measuring current is less than the predefined test threshold.

In addition, an electricity meter such as described above is proposed, the processing component comprising a test input belonging to the test measuring chain and a main input belonging to the main measuring chain, the test input and the main input being connected to one same analogue-to-digital converter integrated in the processing component.

In addition, an electricity meter such as described above is proposed, the test generation chain comprising a first switch located between the conductor and the voltage generator, the processing component being arranged to close the first switch, such that the test generation chain applies the test voltage on the conductor.

In addition, an electricity meter such as described above is proposed, the test measuring chain comprising a second switch connected to the conductor and a detection chain located downstream from the second switch, the processing component being arranged to close the second switch, such that the test current circulates in the test measuring chain.

In addition, an electricity meter such as described above is proposed, the detection chain successively comprising, from upstream to downstream, a high-pass filter, an envelope detector, an analogue-to-digital converter and a digital low-pass filter.

In addition, an electricity meter such as described above is proposed, the electricity meter being a multiphase meter comprising a plurality of front circuits, each front circuit being arranged to be connected to an external current transformer located outside of the meter and mounted on one of the phases of a multiphase distribution network.

In addition, an electricity meter such as described above in proposed, the test generation chain comprising one single voltage generator and several first switches, each first switch being connected to one of the front circuits.

In addition, an electricity meter such as described above is proposed, the test measuring chain comprising one single detection chain and several second switches, each second switch being connected to one of the front circuits.

In addition, a test method is proposed, implemented in the processing component of an electricity meter such as described above, and comprising the steps of:
- applying, by the test generation chain, the test voltage on the conductor;
- acquiring the level of the test voltage via the test measuring chain;
- detecting a cutoff of the external current transformer when the level of the test voltage is greater than a predefined detection threshold.

In addition, a computer program is proposed comprising instructions which drive the processing component of the electricity meter such as described above to execute the steps of the test method such as described above.

In addition, a recording support which can be read by a computer is proposed, on which the computer program such as described above is recorded.

The invention can be better understood in the light of the following description of a particular, non-limiting embodiment of the invention.

BRIEF DESCRIPTION OF THE DRAWINGS

Reference will be made to the appended drawings, from which among.

DETAILED DESCRIPTION OF THE INVENTION

Figure 1:
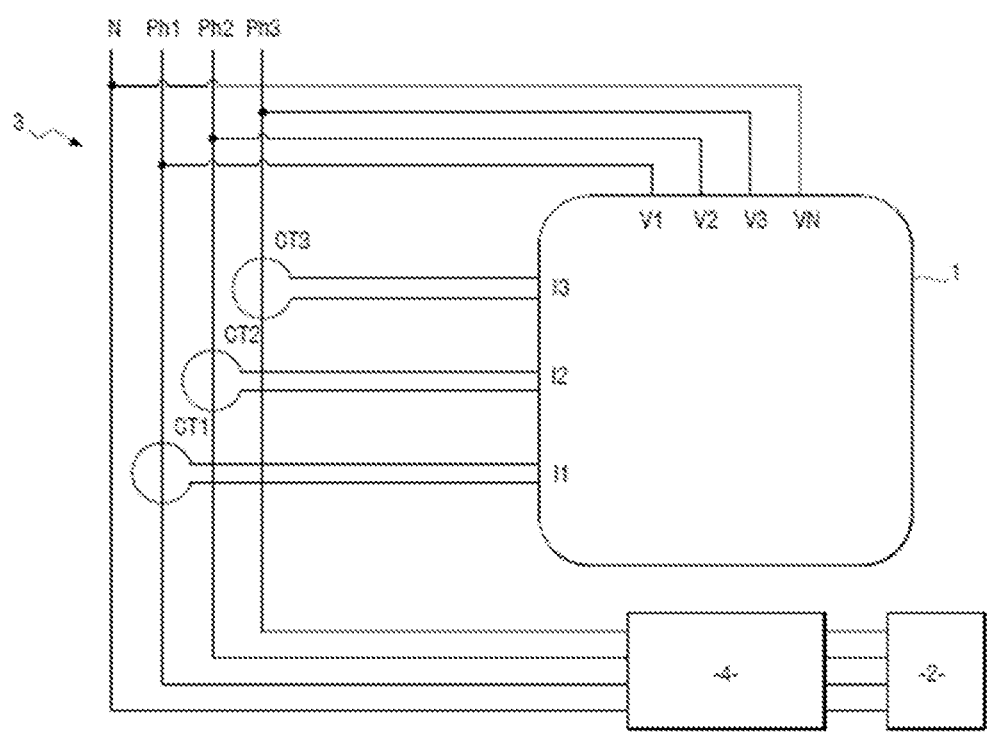
FIG. 1 represents an three-phase electricity meter according to the invention connected to external transformers mounted on the phases of a distribution network, in a four-wire configuration.

In reference to FIG. 1, the electricity meter according to the invention 1 is here a three-phase meter which is intended to measure the electrical energy supplied to the installation 2 of a subscriber by a distribution network 3. This installation 2 is an industrial installation.

The distribution network 3 here comprises three phases Ph1, Ph2, Ph3 and a neutral N (four-wire configuration). A circuit breaker 4 is positioned "at the border" between the distribution network 3 and the installation 2. The three phases Ph1, Ph2, Ph3 and the neutral N enter into the circuit breaker 4 and emerge from it towards the installation 2. The circuit breaker 4 makes it possible to cut off the electrical energy distribution.

The meter 1 comprises four voltage inputs V1, V2, V3, VN and three current inputs I1, I2, I3 (each current input comprising two ports).

The voltage input V1 is connected to the phase Ph1, the voltage input V2 is connected to the phase Ph2, the voltage input V3 is connected to the phase Ph3 and the voltage input VN to the neutral N.

The current input I1 is connected to an external current transformer CT1 mounted on the phase Ph1, the current input I2 is connected to an external current transformer CT2 mounted on the phase Ph2, and the current input 13 is connected to an external current transformer CT3 mounted on the phase Ph3. The external current transformers are located outside of the meter 1.

Each external current transformer here has a transformation ratio equal to 2000.

The meter 1 recovers an image of the phase currents circulating on the phases Ph1, Ph2 and Ph3 thanks to the external transformers CT1, CT2 and CT3, as well as the voltages on the voltage inputs V1, V2 and V3, to take metrological measurements.

Figure 2:
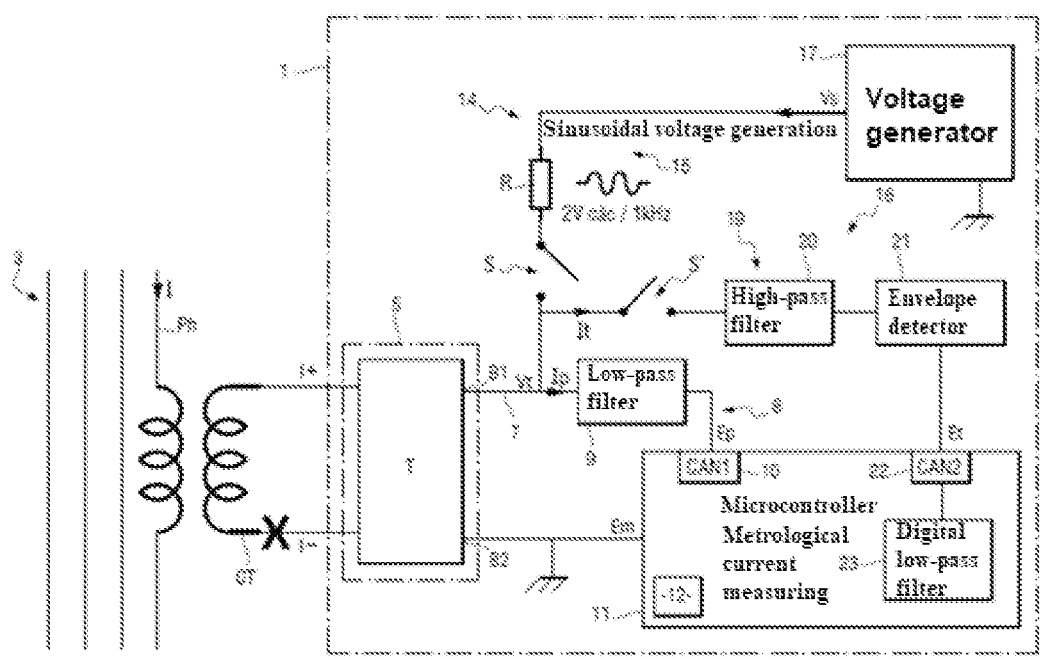
FIG. 2 represents an electrical diagram of the meter according to the invention.

In reference to FIG. 2, for each external current transformer CT (and therefore for each current input comprising two ports I+ and I−), the meter 1 comprises a front circuit 5 which is connected to said external transformer CT.

The front circuit 5 here comprises an internal current transformer T which is connected to the external current transformer CT. More specifically, the two terminals of the primary of the internal transformer T are connected to the two terminals of the secondary of the external transformer CT. The internal transformer T is a ferromagnetic toroidal transformer.

The internal transformer T here has a transformation ratio equal to 1.

The meter 1 comprises a conductor 7 which is connected to the external transformer CT via the front circuit 5. The conductor 7 is connected to a first terminal B1 of the secondary of the internal transformer T.

The meter 1 in addition comprises a main measuring chain 8.

The input of the main measuring chain 8 is connected to the conductor 7.

A main measuring current Ip circulates in the main measuring chain 8. The main measuring current Ip is a representative image of the phase current I which circulates over the phase Ph on which is mounted the external transformer CT. The main measuring chain 8 is intended, in operation, to measure the main measuring current Ip to evaluate the phase current I.

The main measuring chain 8 comprises, from downstream to upstream, a low-pass filter 9, a first analogue-to-digital converter (ADC) 10, and a processing component 11. Here, by "upstream", this means on the side of the distribution network 3, and by "downstream", this means on the side of the measurement.

The processing component 11 is here a microcontroller.

The first ADC 10 is here integrated in the microcontroller 11.

The low-pass filter 9 is an active filter (of equal cutoff frequency, for example, to 5 kHz) integrating a gain (equal, fo example, to 1). The low-pass filter 9 makes it possible to remove intefering noises, internal to the meter 1 or coming from the distribution network 3, which are likely to degrade the measurement of the main measuring current Ip (and therefore the evaluation of the phase current I).

The microcontroller 11 is adapted to executing instructions of a program to implement the test method which will be described. The program is stored in a memory 12, which is integrated in or connected to the microcontroller 11.

The low-pass filter 9 has an input connected to the input of the main measuring chain 8 (and therefore to the conductor 7 and to the first terminal B1 of the secondary of the internal transformer T), and an output connected to a main input Ep of the microcontroller 11. The main input Ep is connected internally to the first ADC 10.

The low-pass filter 9 integrates a measuring resistance (not represented), which has a terminal connected to the conductor 7 and a terminal connected to the ground.

This measuring resistance makes it possible to transform the main measuring current Ip into an image voltage of the main measuring current Ip, which is filtered by the low-pass filter 9 and applied on the input Ep.

The first ADC 10 of the microcontroller 11 therefore produces digital measurements of the image voltage and therefore of the main measuring current Ip circulating in the main measuring chain 8.

The second terminal B2 of the secondary of the internal transformer T is connected to the ground and to a ground input Em of the microcontroller 11.

In addition, the meter 1 comprises a test circuit 14 comprising a test generation chain 15, a test measuring chain 16 and the microcontroller 11. The microcontroller 11 therefore belongs here both the main measuring chain 8 and to the test circuit 14.

The output of the test generation chain 15 is connected to the connector 7.

The test generation chain 15 comprises, from upstream to downstream, a first switch S, a resistance R and a voltage generator 17. The first switch S is therefore located between the conductor 7 and the voltage generator 17.

The voltage generator 17 produces an output voltage Vs, for example a 2V sinusoidal The voltage generator 17 produces an output voltage Vs, for example a 2V peak-to-peak sinusoidal voltage with a frequency of 1 kHz.

The resistance R has a resistance value equal to 500 kΩ.

The output of the voltage generator 17 is connected to a first terminal of the resistance R. A second terminal of the resistance R is connected to the terminal of the first switch S which is not connected to the output of the test generation chain 15.

The input of the test measuring chain 16 is connected to the conductor 7, and therefore to the output of the test generation chain 15.

The test measuring chain 16 comprises, from upstream to downstream, a second switch S' and a detection chain 19. The second switch S' has a terminal connected to the input of the test measuring chain 16 and a terminal connected to the detection chain 19.

The detection chain 19 comprises, from upstream to downstream, a high-pass filter 20, an envelope detector 21, a second ADC 22 and a digital low-pass filter 23. The second ADC 22 is integrated in the microcontroller 11. The digital low-pass filter 23 is programmed in the microcontroller 11.

Here, the high-pass filter 20 is an active filter (of cutoff frequency, for example, equal to 500 Hz) integrating a gain (for example, equal to 1).

The high-pass filter 20 and the envelope detector 21 are mounted in series. An output of the shell detector 21 is connected to a test input Et of the microcontroller 11. This test input Et is connected internally to the second ADC 22.

The low-pass filter 23 acquires the digital measurements produced by the second ADC 22. The low-pass filter 23 here has a gain equal to 1 and a cutoff frequency of 10 Hz.

The first switch S and the second switch S' are controlled by the microcontroller 11.

The first switch S makes it possible to control the application of the test voltage Vt on the conductor 7.

By default, the first switch S is in the open state, such that no voltage is applied by the test generation chain 15 on the conductor 7 and therefore on the secondary of the internal transformer T.

The second switch S' makes it possible to selectively connect or disconnect the test measuring chain 16 of the conductor 7, and therefore of the secondary of the internal transformer T and of the main measuring chain 8. The second switch S' is, by default, in the open state.

To detect if the external transformer CT is open (cutoff), the microcontroller 11 first acquires a level Np of the main measuring current Ip (which is measured by the main measuring chain 8), and compares the level Np with a predefined test threshold St. The level Np is, for example, an effective value of the main measuring current Ip.

When the level Np is less than the predefined test threshold, i.e. when:
Np<St,
the microcontroller 11 closes the first switch S and the second switch S'. The first switch S and the second switch S' can be closed simultaneously, or one after the other. The two switches are kept closed for the measuring time.

By closing the first switch S, the microcontroller 11 controls the test generation chain 15, such that this generates the test voltage Vt on the conductor 7. The test voltage Vt results from the output voltage Vs.

The application of the test voltage Vt generates currents which circulate in the different branches connected to the conductor 7. The application of the test voltage Vt produces, in particular, a test current It which circulates in the test measuring chain 16.

The level of the test voltage Vt depends on the equivalent impedances of the different branches connected to the conductor 7 and therefore, in particular, of the equivalent impedance of the front circuit 5 and of the external transformer CT.

When the external transformer CT is cut off, the equivalent impedance of the front circuit 5 and of the external transformer CT is greater: the test voltage Vt increases.

The test measuring chain 16 therefore measures the level Nt of the test voltage Vt.

The microcontroller 11 acquires the level Nt of the test voltage Vt (exiting the digital low-pass filter 23) and compares it with a predefined detection threshold Sd.

If the level Nt of the test voltage Vt is greater than the predefined detection threshold, i.e. if:
Nt>Sd, then the microcontroller 11 detects an opening of the external transformer CT.

The predefined detection threshold Sd is typically equal to 0.75V.

Otherwise, the microcontroller 11 detects an absence of cutoff of the external transformer CT.

The high-pass filter 20 and the envelope detector 21 make it possible, on the one hand, to remove 50 Hz and the possible disruptions coming from the distribution network 3, and on the other hand, to have at the second ADC 22, a quasi-continuous signal which is filtered (digitally) by the low-pass filter 23.

The test voltage Vt is generated for a determined duration D, with, for example:
D=1s.

The measurement is repeated at predetermined regular intervals T, with, for example:
T=10 mn,
and this, as long as Np<St.

When the meter 1 detects a cutoff of the external transformer CT, the meter 1 produces an alarm and transmits it to the distributor and/or to the customer, via conventional communication means: wired or wireless, radio, by online carrier currents, etc.

It is noted that it is advantageous to calibrate, in the factory, the output voltage Vs of 2V peak-to-peak at 1 kHz produced by the voltage generator 17, to adjust the permanent steady state measurements so as to have an adequate performance of the levels relative to the predefined detection threshold Sd.

The injection of the calibrated test voltage Vt, of a significant level, between the two terminals of the secondary of the internal transformer T, therefore makes it possible to detect a modification of the equivalent impedance between said two terminals. Thus, a very robust criterion is constructed for detecting cutoff of the external transformer CT.

The frequency of 1 kHz is sufficiently remote from the frequency of the network 3 to ensure that the detection is not polluted by said frequency of the network 3.

It is noted that the active filters are of the first order, and that the static gains of the filters are adapted in order to avoid saturations at the ADCs, and so as to apply at the input of the ADCs, signals having significant levels (and corresponding to the input ranges of the ADCs).

As has been seen, the meter 1 is a multiphase meter, three-phase in this case. The principle of the invention which has just been described applies for the three phases of the meter 1.

The meter 1 thus comprises three front circuits 5 (one per phase) each arranged to be connected to one of the external current transformers CT1, CT2, CT3.

The test circuit 14 comprises one single processing component (the microcontroller 11).

The test generation chain 15 comprises one single voltage generator 17 and several first switches S1, S2, S3 (one per phase), each first switch being connected to one of the front circuits 5.

The three first switches S1, S2, S3 are controlled by the microcontroller 11.

Likewise, the test measuring chain 16 comprises one single detection chain 19 and several second switches S'1, S'2, S'3 (one per phase), each second switch being connected to one of the front circuits 5.

Only one of the three first switches can be closed at a given time, to inject the test voltage Vt on one single phase. Likewise, only one of the three second switches can be closed at a given time, to select the phase on which the measurement must be taken. For a given phase Phi (i going from 1 to 3), the measurement is taken when the two switches Si, S'i associated with said phase are both closed and that all the other switches are open.

It is noted that as an option, an external transformer can be had, mounted on the neutral N and connected to a fourth current input IN of the meter 1. The invention is thus implemented in the same way to detect an opening of the external current transformer on the neutral.

Figure 3:
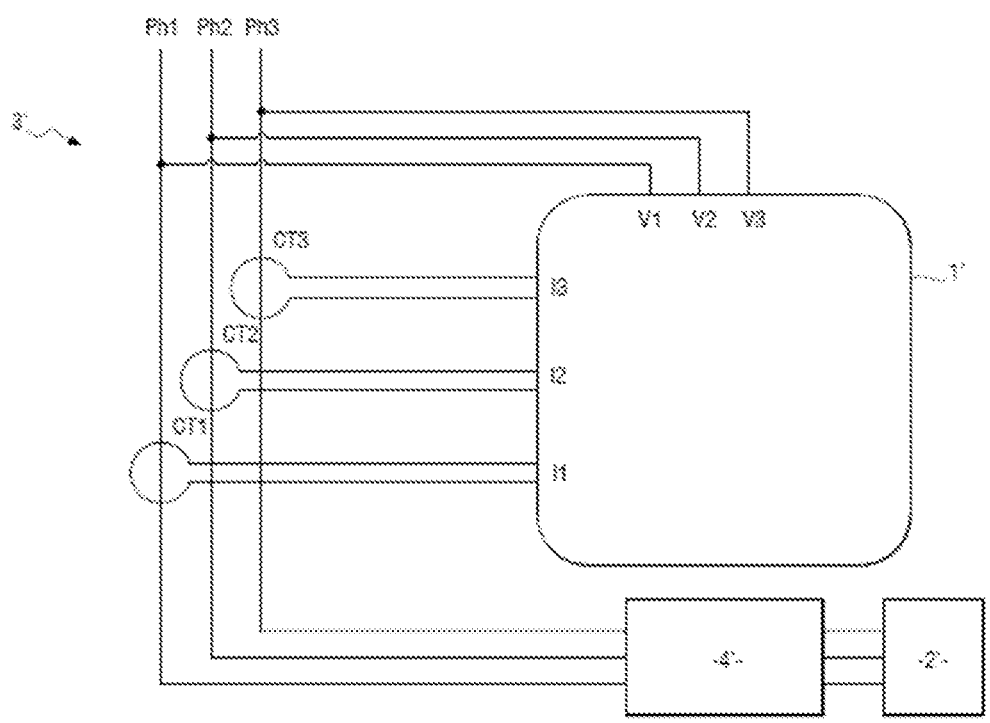
FIG. 3 is a figure similar to FIG. 1, in a three-wire configuration.

In FIG. 3, the electricity meter according to the invention 1' is again a three-phase meter which is intended to measure the electrical energy supplied to the installation 2' of a subscriber by a distribution network 3' (via a circuit breaker 4'). The installation 2' is again an industrial installation.

This time, the distribution network 3' comprises three phases Ph1, Ph2, Ph3 only (no neutral), and the meter only comprises three voltage inputs V1, V2, V3 (as well as three current inputs I1, I2, I3). The external transformers CT1, CT2, CT3 are installed on the phases Ph1, Ph2, Ph3. The meter 1' comprises a test circuit (integrating a test generation chain and a test measuring chain) structurally similar to that of the meter 1 and operating in the same way.

Of course, the invention is not limited to the embodiment described, but includes any variant entering into the scope of the invention.

The invention can be implemented with a single-phase, or multiphase electricity meter, and connected to any number of phases.

The architecture of the meter could, of course, be different from that described here.

Here, it has been described that the microcontroller 11 belongs to both the main measuring chain and to the test circuit. However, a first microcontroller could be had, integrating a first ADC and dedicated to the main measuring chain, and a second microcontroller integrating a second ADC and dedicated to the test circuit.

Likewise, it is possible to use one single ADC integrated in a microcontroller and belonging to both the main measuring chain and to the test measuring chain. The microcontroller thus comprises a main input belonging to the main measuring chain and a test input belonging to the test measuring chain. The test input and the main input are connected to the ADC, which integrates a multiplexer having (at least) two inputs connected respectively to the test input and to the main input, as well as an output connected to the conversion core of the ADC.

The ADC(s) can also be one or more ADCs external to the microcontroller.

The low-pass filter of the main measuring chain, just like the high-pass filter and the envelope detector of the test measuring chain, could be software components programmed in the microcontroller; in this case, the ADC(s) is/are positioned upstream from these modules.

The processing component is not necessarily a microcontroller, but could be a different component, and for example a conventional processor, a DSP (Digital Signal Processor), or a programmable logic circuit such as an FPGA (Field Programmable Gate Array) or an ASIC (Application Specific Integrated Circuit).

The front circuit does not necessarily comprise an internal current transformer, but can comprise any components, even only conductive elements connecting respectively the conductor 7 and the ground to the ports I+ and I–.

The invention claimed is:

1. An electricity meter comprising:
    a front circuit arranged to be connected to an external current transformer located outside of the electricity meter and mounted on a phase of a distribution network;
    a conductor arranged to be connected to the external current transformer via the front circuit;
    a test circuit comprising a test generation chain having an output connected to the conductor, a test measuring chain having an input connected to the conductor, and a processing component;
    the test generation chain comprising a voltage generator and being arranged to apply a test voltage on the conductor, the test voltage producing a test current circulating in the test measuring chain and said test voltage having a level which depends on an equivalent impedance of the front circuit and of the external current transformer, the test measuring chain being arranged to measure the level of the test voltage, the processing component being arranged to acquire the level of the test voltage and to detect a cutoff of the external current transformer when the level of the test voltage is greater than a predefined detection threshold.

2. The electricity meter according to claim 1, wherein front circuit comprises an internal current transformer arranged to be connected to the external current transformer.

3. The electricity meter according to claim 1, further comprising a main measuring chain having an input connected to the conductor, the main measuring chain being arranged such that a main measuring current, image of a phase current circulating over the phase, circulates in the main measuring chain, the processing component being arranged to acquire a level of the main measuring current, to compare it with a predefined test threshold, and to control the test generation chain such that this applies the test voltage on the conductor when the level of the main measuring current is less than the predefined test threshold.

4. The electricity meter according to claim 3, the processing component comprising a test input belonging to the test measuring chain and a main input belonging to the main measuring chain, the test input and the main input being connected to one same analogue-to-digital converter integrated in the processing component.

5. The electricity meter according to claim 1, the test generation chain comprising a first switch located between the conductor and the voltage generator, the processing component being arranged to close the first switch (S) such that the test generation chain applies the test voltage on the conductor.

6. The electricity meter according to claim 5, the electricity meter being a multiphase meter comprising a plurality of front circuit, each front circuit being arranged to be connected to an external current transformer located outside of the meter and mounted on one of the phases of a multiphase distribution network, the test generation chain comprising one single voltage generator and several first switches, each first switch being connected to one of the front circuits.

7. The electricity meter according to claim 1, the test measuring chain comprising a second switch connected to the conductor and a detection chain located downstream from the second switch, the processing component being arranged to close the second switch such that the test current circulates in the test measuring chain.

8. The electricity meter according to claim 7, the detection chain successively comprising, from upstream to downstream, a high-pass filter, an envelope detector, an analogue-to-digital converter and a digital low-pass filter.

9. The electricity meter according to claim 7, the electricity meter being a multiphase meter comprising a plurality of front circuit, each front circuit being arranged to be connected to an external current transformer located outside of the meter and mounted on one of the phases of a multiphase distribution network, the test measuring chain comprising one single detection chain and several second switches, each second switch being connected to one of the front circuits.

10. The electricity meter according to claim 1, the electricity meter being a multiphase meter comprising a plurality of front circuit, each front circuit being arranged to be connected to an external current transformer located outside of the meter and mounted on one of the phases of a multiphase distribution network.

11. A test method, implemented in the processing component of an electricity meter according to claim 1, and comprising the steps of:
  applying, by the test generation chain, the test voltage on the conductor;
  acquiring the level of the test voltage via the test measuring chain;
  detecting a cutoff of the external current transformer when the level of the test voltage is greater than a predefined detection threshold.

12. A non-transitory computer readable storage medium having stored thereon a computer program comprising instructions that cause the processing component of the test circuit of the electricity meter according to claim 1, to execute a test method comprising:
  applying, by the test generation chain, the test voltage on the conductor;
  acquiring the level of the test voltage via the test measuring chain;
  detecting a cutoff of the external current transformer when the level of the test voltage is greater than a predefined detection threshold.

* * * * *